United States Patent
Poeppelman et al.

(10) Patent No.: US 6,279,137 B1
(45) Date of Patent: Aug. 21, 2001

(54) SYSTEM AND METHOD FOR A STORAGE-EFFICIENT PARALLEL CHIEN SEARCH

(75) Inventors: Alan D. Poeppelman; Mark D. Rutherford, both of Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/207,553

(22) Filed: Dec. 8, 1998

(51) Int. Cl.[7] ................................................. H03M 13/03
(52) U.S. Cl. ............................................. 714/781; 714/784
(58) Field of Search ..................................... 714/784–789, 714/781, 761, 759, 775, 762, 752, 757, 758; 708/492, 525; 707/7, 6; 712/221; 375/220; 700/46–47

(56) References Cited

U.S. PATENT DOCUMENTS

| | | | |
|---|---|---|---|
| 4,584,686 | 4/1986 | Fritze | 371/37 |
| 4,642,808 | 2/1987 | Baggen | 371/39 |
| 4,644,543 | 2/1987 | Davis, Jr. | 371/37 |
| 4,833,678 | * 5/1989 | Cohen | 714/781 |
| 4,839,896 | 6/1989 | Glover et al. | 371/37 |
| 4,868,828 | 9/1989 | Shao et al. | 371/5.1 |
| 5,365,529 | 11/1994 | Mester | 371/37.1 |
| 5,434,026 | 7/1995 | Takatsu et al. | 430/30 |
| 5,504,758 | * 4/1996 | Inoue et al. | 714/775 |
| 5,517,509 | 5/1996 | Yoneda | 371/37.1 |
| 5,715,262 | 2/1998 | Gupta | 371/37.1 |
| 5,771,224 | * 6/1998 | Reed et al. | 714/752 |
| 5,912,905 | * 6/1999 | Sakai et al. | 714/784 |
| 6,061,826 | * 5/2000 | Thirumoorthy et al. | 714/784 |
| 6,192,497 | * 2/2001 | Yang et al. | 714/781 |

OTHER PUBLICATIONS

Chi (A new fast Reed–Solomon decoding algorithm without Chien search; IEEE, Oct. 14, 1993).*
Kyutaeg Oh et al. (An efficient Reed–Solomon decoder VLSI with erasure correction; IEEE, Nov. 5, 1997).*
Hung–Wei Chen et al.(A new VLSI architecture of Reed Solomon decoder with erasure function; IEEE, Nov. 17, 1995).*
Xu (Complexity of implementation for evaluating polynomials over GF(2/sup m/); IEEE, Sep. 12, 1991).*
LeNgoc et al.(A PC–based general purpose Reed–Solomon codec simulator; IEEE, Sep. 28, 1994).*

* cited by examiner

Primary Examiner—Albert Decady
Assistant Examiner—Guy Lamarre (57) ABSTRACT

A system determines the root of a polynomial by employing a parallel structure that implements a Chien Search and minimizes the amount of storage required. The location of an error in a codeword can be derived from the root of an error locator polynomial. The performance of the Chien Search is enhanced by the parallel structure, and the location of the error can be easily determined using a simple calculation that preferably includes the cycle count, the parallelism, and the index of the multiplier/summer rank that indicates a root. Multiple ranks of multipliers receive data stored in a single array of data storage units. Multiplier values of each multiplier are based on the elements of a Galois Field. A method configures data storage units, multipliers, summers, and comparators, and performs a Chien Search. The location of an error in a codeword is determined using a simple calculation based on a determined root of an error locator polynomial.

30 Claims, 7 Drawing Sheets

SYSTEM AND METHOD FOR A STORAGE-EFFICIENT PARALLEL CHIEN SEARCH

BACKGROUND OF THE INVENTION

1. Field of the Invention

The present invention pertains generally to error detection/correction and more particularly to systems and methods used in Reed-Solomon (RS) coding and decoding for error correction.

2. Description of Related Art

Digital processing has become pervasive in modern society. For example, digital processing circuitry is commonly employed in many modern products, including personal computers, automobiles, communications equipment, and common household devices. One advantage of digital processing circuitry is that it can perform complex operations at rapid speeds, which has allowed activities previously considered impractical to be readily implemented. A familiar example of a digital processing system is a compact disc system reading digital data from a digital compact disc.

The communication of digital data is often a crucial component of digital processing systems. Typically, data is read from or written to local or remote data storage locations in successive read and write operations across a communications link. In such data storage locations, data is preferably stored as binary digits called "bits". In the example of a compact disc system, bit data is generally read from the compact disc and communicated among internal or external components, such as a microprocessor or a digital sound card in a personal computer.

Figure 1A:
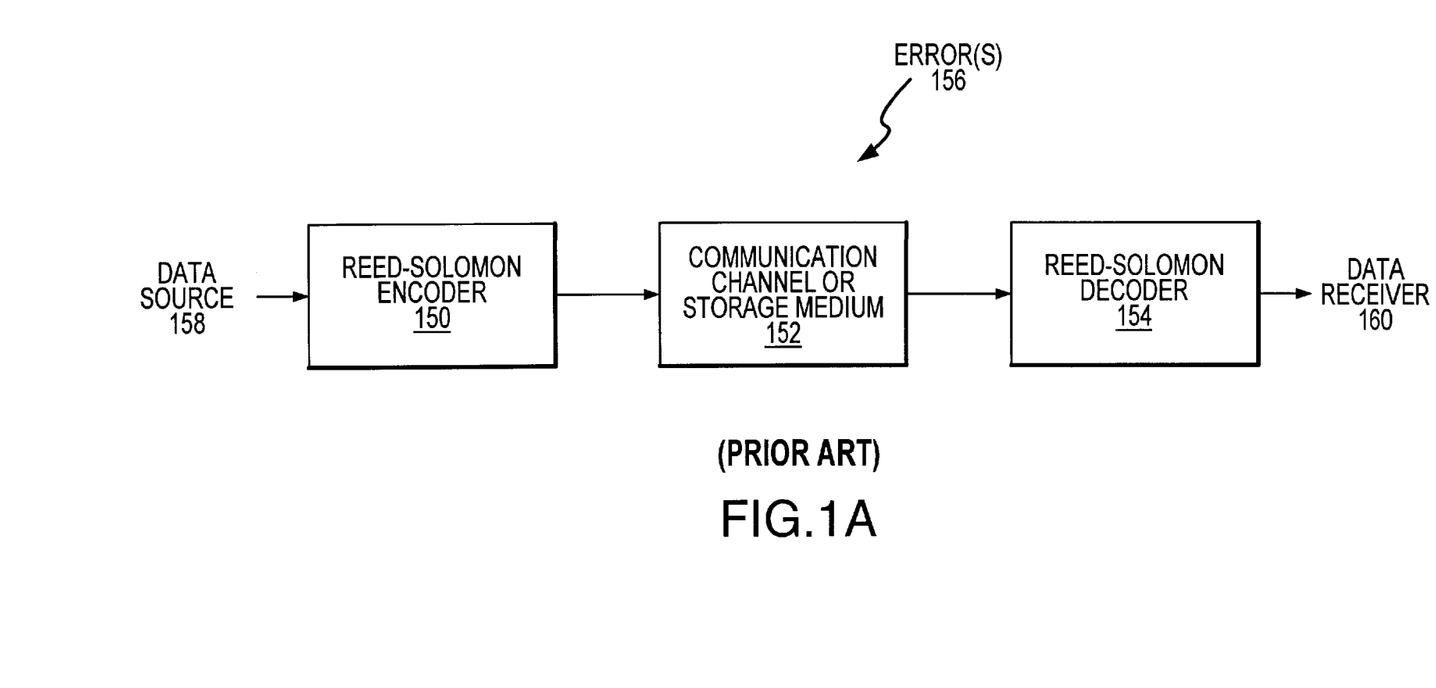
FIG. 1A depicts an overview of part of a digital processing system.

FIG. 1A illustrates an overview of a digital processing system including an RS encoder 150, a communication channel or storage medium 152, and an RS decoder 154. An original data message is received from a data source 158, encoded by the RS encoder 150 and transferred over a communication channel 152 or stored in storage medium 152. The RS decoder 154 receives or reads the transferred data and decodes it to extract the original data message before sending the original data message to the data receiver 160. As shown in FIG. 1A, errors 156 are sometimes introduced during the transfer of the data bits as a result of, for example, channel distortion or noise. Errors 156 can also be introduced by defects of the data storage locations at which the data is stored. Such errors are typically rare in relation to the total amount of data transferred correctly. In some systems, however, a particular kind of data error, called a "burst error", occurs in consecutive data bits. Burst errors are often caused on compact discs, for example, by scratches, fingerprints, or other physical defects on the disc.

Consequently, to ensure data integrity within the system (i.e., to produce correct results), data errors must be detected and corrected. To facilitate error detection and correction of the data, encoding techniques are often used to encode the data prior to its transfer or storage. By encoding the data, redundancies are introduced upon the data. Typically, encoding is accomplished by dividing the message data word by a generating polynomial and appending the remainder to the message data. Such redundancies increase the likelihood that the data can be recovered even if errors are introduced into the data during its transfer. Once transferred, the encoded data is thereafter decoded to recreate the original (i.e., pre-encoding and transfer) data values.

Various coding schemes have been developed and are commonly used in digital processing and communication devices. Industry-wide standards have been set forth for coding and error correction schemes to provide intercompatibility of products and devices constructed by different manufacturers. Standards have been set forth, for instance, for the encoding of data stored on optical storage devices, such as CD-ROM storage devices.

Reed-Solomon (RS) coding is exemplary of a coding scheme typically utilized to encode digital data. Error-correction operations, however, are computationally intensive, and as products and systems emerge in which data is transferred at quicker rates, the rates at which error-correction operations must be performed must be increased correspondingly. Likewise, higher density semiconductor technologies and the faster transfer rates increase the possibility of errors and, therefore, necessitate more robust error detection and correction. When more powerful RS codes are employed (e.g., those capable of correcting three or more burst errors), the decoding algorithm becomes difficult to solve using only algebraic methods. The first part of a standard decoding algorithm, for example, calculates the partial syndromes of a codeword and converts them into the coefficients (i.e., $\Lambda_n$) of an error-locator polynomial $\Lambda(x)$, which has the property that its roots correspond directly to the location of the errors in the codeword. A partial syndrome is calculated by dividing a polynomial representing the received codeword by a factor of the generating polynomial. The remainder of this division operation is a partial syndrome. The second part of a decoding algorithm is to determine the roots of the error locator polynomial. For error-locator polynomials of small degree, the roots can be reasonably calculated algebraically. For error locator polynomials of high degree, however, a brute force method is preferably employed to evaluate the polynomial with every possible root value and determine which roots produce a zero result (where a zero result indicates a error location).

For these more powerful codes, a decoding algorithm may employ a method known as a Chien Search. Because the Chien Search must test every possible value, it is often the most time consuming and computationally intensive part of the decoding algorithm. Therefore, it is advantageous to perform the Chien Search in parallel to reduce the execution time for error correction. In prior designs, this parallelism was achieved by merely replicating serial Chien Search logic and parceling out portions of the search to each parallel module. The technique, however, is costly because the replication requires a significant number of logic gates. As such, need exists for a less costly design for implementing a parallel Chien Search.

SUMMARY OF THE INVENTION

A system and method in accordance with the present invention is capable of determining a root of a polynomial, where possible roots are elements of a Galois Field. An embodiment of the present invention can, for example, be utilized to find the roots of an error-locator polynomial to determine the location of an error in a codeword. In accordance with the present invention, the amount of storage required to determine the roots of the polynomial may be minimized by coupling parallel multiplier ranks to receive operands from a single rank of data storage units.

It is therefore an advantage of an embodiment of the present invention that logic gates are minimized in a Chien Search circuit.

It is another advantage of an embodiment of the present invention that memory requirements are minimized in a Chien Search program.

Another advantage of an embodiment of the present invention is that the Chien Search performance may be improved by increasing the parallelism of the implementation without requiring a proportionate increase in storage required.

Additional objects, advantages, and novel features of the invention are set forth in the description which follows and will become more apparent to those skilled in the art when taken in conjunction with the accompanying drawings. The objects and advantages of the invention may be realized and attained by means of the instrumentalities and accommodations particularly pointed out in the appended claims.

To achieve the foregoing and other objects, in accordance with the purposes of the present invention, as embodied and broadly described herein, a system for a storage-efficient Chien Search in accordance with the present invention comprises a plurality of data storage units for storing a corresponding plurality of stored values; a base rank including a base summer and a plurality of base multipliers for producing a plurality of base product values, each base multiplier corresponding to one of the data storage units and being coupled to multiply the stored value in the corresponding data storage unit by a base multiplier value to produce one of the base product values, the base summer being coupled to sum each of the stored values; at least one parallel rank including a parallel summer and a plurality of parallel multipliers for producing a plurality of parallel product values, each parallel multiplier within the at least one parallel rank corresponding to one of the base multipliers and one of the data storage units and being coupled to multiply the stored value in the corresponding data storage unit by a parallel multiplier value to produce one of the parallel product values, the parallel summer being coupled to sum each of the parallel product values within the at least one parallel rank; and a plurality of comparators, each comparator being configured to identify a non-zero result produced from one of the summers.

The present invention may also comprise, in accordance with its object and purposes, a method comprising the operations of producing a first product value of a base row of multipliers by multiplying a first multiplier value of the base row of multipliers with contents of a first data storage unit, the first multiplier value of the base row of multipliers equaling an element of a Galois Field; producing a first product value of a non-base row of multipliers by multiplying a first multiplier value of the non-base row of multipliers with contents of the first data storage unit, the first multiplier value of the non-base row equaling an alternate element of the Galois Field; recording the first product value of the base row of multipliers in the first data storage unit, responsive to the operation for producing the first product value of the base row of multipliers; coupling the first recorded product value to a first comparator to determine whether the first multiplier value of the base row is a first root of the error-locator polynomial; and coupling the first product value of the non-base row of multipliers to a second comparator to determine whether the first multiplier value of the non-base row is a second root of the error-locator polynomial.

DETAILED DESCRIPTION OF A PREFERRED EMBODIMENT

Figure 1B:
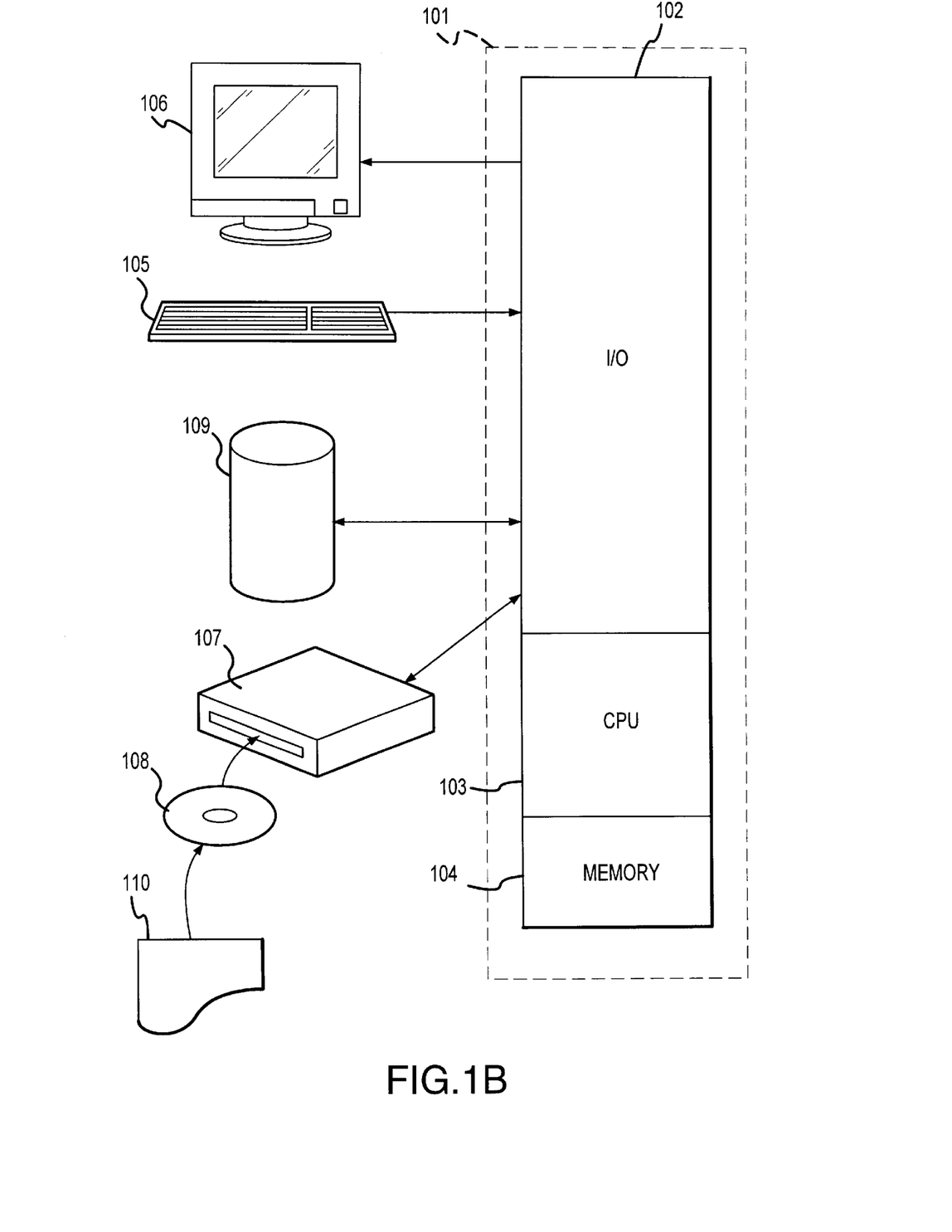
FIG. 1B depicts a general purpose computer in accordance with the present invention.

One operating environment in which the present invention is potentially useful encompasses the general purpose computer. In such a system, data and program files may be input to the computer, which reads the files and executes the programs therein. Some of the elements of a general purpose computer are shown in Figure 1B, wherein a processor 101 is shown having an input/output (I/O) section 102, a Central Processing Unit (CPU) 103, and a memory section 104. The present invention is optionally implemented in software devices loaded in memory 104 and/or stored on a configured CD-ROM 108 or storage unit 109 thereby transforming the computer system in FIG. 1B to a special purpose machine for implementing the present invention.

The I/O section 102 is connected to keyboard 105, display unit 106, disk storage unit 109, and disk drive unit 107. Generally, in contemporary systems, the disk drive unit 107 is a CD-ROM driver unit capable of reading a CD-ROM medium 108, which typically contains programs 110 and data. Computer program products containing mechanisms to effectuate the apparatus and methods in accordance with the present invention may reside in the memory section 104, on a disk storage unit 109, or on the CD-ROM medium 108 of such a system. Alternatively, disk drive unit 107 may be replaced by a floppy drive unit, a tape drive unit, or other storage medium drive unit. Examples of such systems include SPARC systems offered by Sun Microsystems, Inc., personal computers offered by IBM Corporation and by other manufacturers of IBM-compatible personal computers, and other systems running a UNIX-based or other operating system. In accordance with the present invention, Chien Search software may be executed by CPU 103, and data required to accomplish the Chien Search may be stored in memory section 104, disk storage unit 109, disk drive unit 107 or other storage medium drive units coupled to the system.

A RS coding process is essentially a three-step process: (1) encoding the information, (2) decoding the information, and (3) correcting any errors. An RS code, in accordance with the present invention, preferably has a symbol size of 8 bits (one byte per symbol), which means the symbols are elements of the Galois Field $GF(2^8)$ and the maximum codeword length is $2^8-1=255$. The corresponding RS codeword preferably has sixteen symbols (i.e., 128 bits) of correction coding and is capable of correcting eight symbols of error per codeword.

Figure 2:
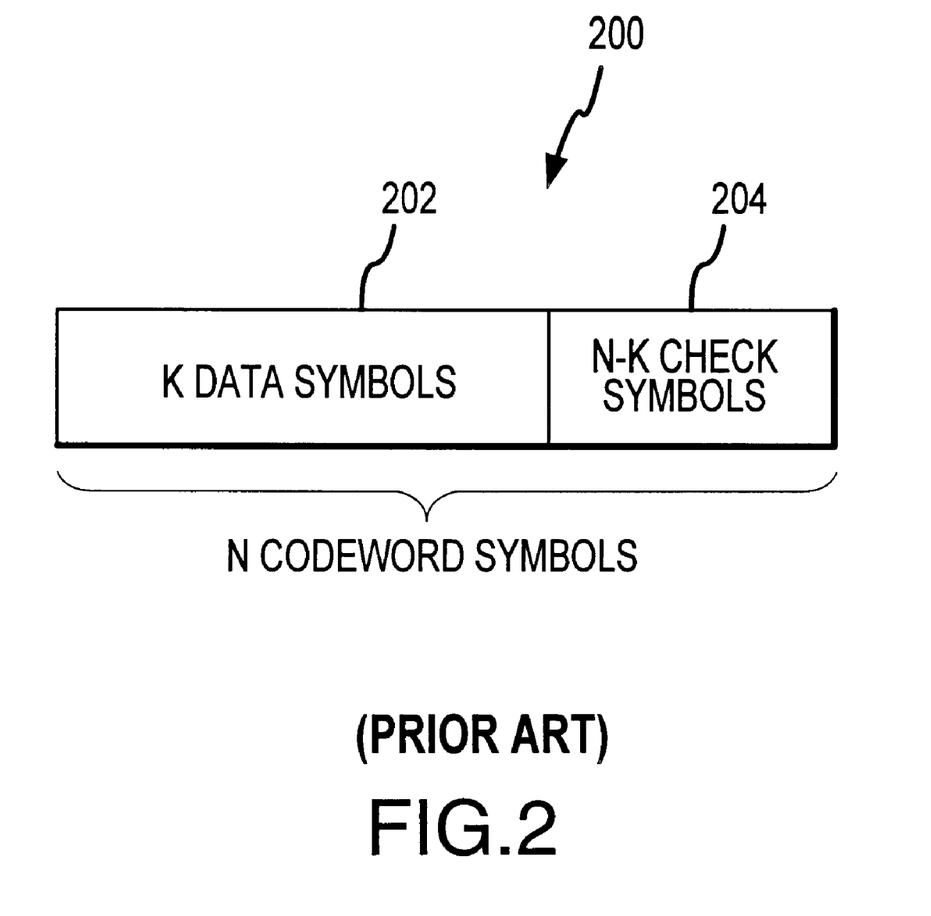
FIG. 2 depicts a data code word including K data symbols and N-K check symbols.

As shown in FIG. 2, an RS coding scheme involves an (N, K) codeword 200 generated by an RS encoder from K message symbols 202, where each codeword 200 of N code symbols consists of the K message symbols 202 and N-K check symbols 204. To illustrate this structure, an original message data word is represented by the message data B, which is encoded into a transmitted codeword T. In the encoding operation, the transmitted codeword T is typically generated by dividing the original message data by the generator polynomial G and appending the remainder to the original message data B. In the embodiment, the generator polynomial G has roots $\alpha^k$, which are elements of a Galois Field $GF(2^8)$, where $k=0, 1, 2, 3, \ldots (N-K-1)$. A detailed description of RS coding techniques is provided in W. Peterson and E. Weldon, "Error-Correcting Codes", $2^{nd}$ edition, M.I.T. Press (1972), specifically incorporated herein by reference for all that it discloses and teaches. After transfer of the data, the received codeword R is decoded. In the decoding operation, partial syndromes are generated by evaluating the received codeword R at $\alpha^k$. In other words, the partial syndromes are algebraically related to error locations and error values in the received codeword R.

In the correcting operation, the resulting partial syndromes are used to determine the location of any errors in the received codeword R. The error locations can be derived from the syndromes by calculating the coefficients (i.e., $\Lambda_i$) of an error locator polynomial using Berlekamp's Algorithm, found in E. Berlekamp, Algebraic Coding Theory (1968) at Chapter 10, specifically incorporated herein by reference for all that it discloses and teaches. The error location polynomial is in the form:

$$\Lambda(x) = \sum_{i=0}^{T} \Lambda_i x^i$$

where T is the number of errors that can be corrected and the $\Lambda$ coefficients are calculated from the partial syndromes. Errors can be located by finding the roots of the error locator polynomial.

A Chien Search is a non-algebraic method of finding the roots of the error locator polynomial. A root is determined by evaluating the error locator polynomial $\Lambda(x)$ for each $\alpha^{-j}$, where $\alpha^{-j}$ is an element of Galois Field $GF(2^8)$ and $j=0, 1, 2, 3, \ldots (2^8-2)$. Where $\Lambda(\alpha^{-j})$ equals zero, $\alpha^{-j}$ is a root and j is the location of an error in the codeword. Finding the roots to the error locator polynomial can be done either in firmware or hardware; however, the Chien Search is a very computationally intensive technique. If the Chien Search is implemented in firmware, it is preferable to employ a processor with a finite field multiply opcode. Parallelism in a software embodiment may be achieved, for example, in a system employing multiple processors.

Figure 3:
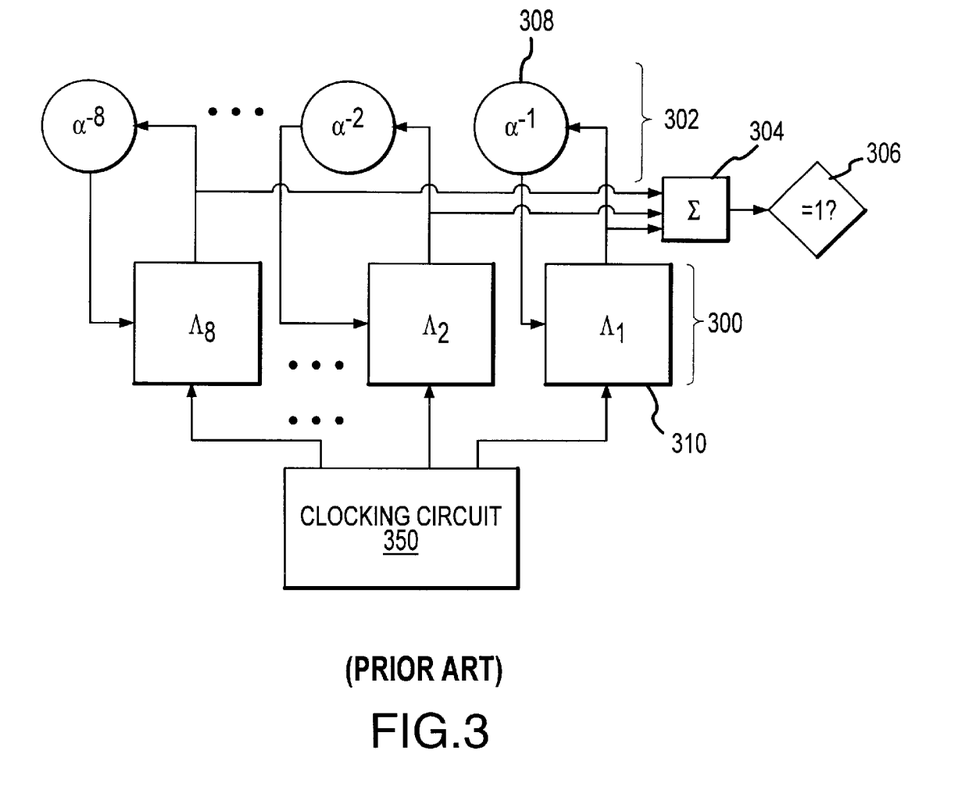
FIG. 3 depicts a block diagram of a serial Chien Search embodiment.

FIG. 3 illustrates an initial state of an exemplary embodiment of Chien Search logic implemented serially in hardware. Alternately, the Chien Search can be implemented in software executing on one or more microprocessors. The coding scheme associated with the Chien Search of FIG. 3 can correct eight errors in a codeword. The registers 300 are preferably initialized with coefficients $\Lambda_1$ through $\Lambda_8$ of the error locator polynomial. Other types of data storage units can be used in place of registers 300, such as memory arrays. The register label (e.g., $\Lambda_i$) in FIG. 3 represents only the initial value of the corresponding register. During the Chien Search, the stored value in each register preferably changes in accordance with one or more multiplication operations. Each of the fixed finite field multipliers 302 are coupled to a corresponding one of the registers 300. The value of each multiplier is applied to the contents of the corresponding register, and the product of the multiplication is re-stored in the register. The output of each register 300 is also input to the summer 304, which in a preferred embodiment performs a logical byte-wide XOR operation on values input thereto. For example, the fixed finite field multiplier 308 has a value of $\alpha^{-1}$ and is multiplied with the value stored in the register 310, which in a first cycle is equal to $\Lambda_1$. The product, $\Lambda_1\alpha^{-1}$, is loaded in the register 310. In the same cycle, the other multipliers and registers operate in a similar manner, with a resulting product being loaded in a corresponding register as a stored value. The stored values are also received by the summer 304 and summed, such as by an XOR operation. The comparator 306 determines whether the output of the summer 304 equals one, which indicates that the element $\alpha^{-j}$ tested during the most recent cycle is a root of the error locator polynomial.

Clocking circuitry 350 is coupled to each of the registers 300 to cycle the registers. In a first clock cycle, the Chien Search logic of FIG. 3 evaluates $\Lambda(\alpha^{-0})$ to determine if $\alpha^{-0}$ is a root of the error locator polynomial. In a subsequent clocking or instruction cycle, a similar operation is performed, except that the register 310 now contains $\Lambda_1\alpha^{-1}$. Therefore, in this subsequent cycle, the value $\alpha^{-1}$ of fixed finite field multiplier 308 is multiplied with the current value, $\Lambda_1\alpha^{-1}$, stored in the register 310, resulting in a new product of $\Lambda_1\alpha^{-2}$ (i.e., $\Lambda_1\alpha^{-1}$ times $\alpha^{-1}$ equals $\Lambda_1\alpha^{-2}$). As in the first cycle, the new product is loaded in the register 310 as a stored value, as are the new products from the other multipliers. In this cycle, the Chien Search logic of FIG. 3 evaluates $\Lambda(\alpha^{-1})$ to determine if it is a root of the error locator polynomial. The evaluation of elements of the Galois Field continues in this manner until j equals 254, thereby evaluating all possible roots of the error locator polynomial. Accordingly, the serial Chien Search logic of FIG. 3 requires 255 cycles to exhaustively evaluate the error locator polynomial for all 255 possible roots.

Figure 4:
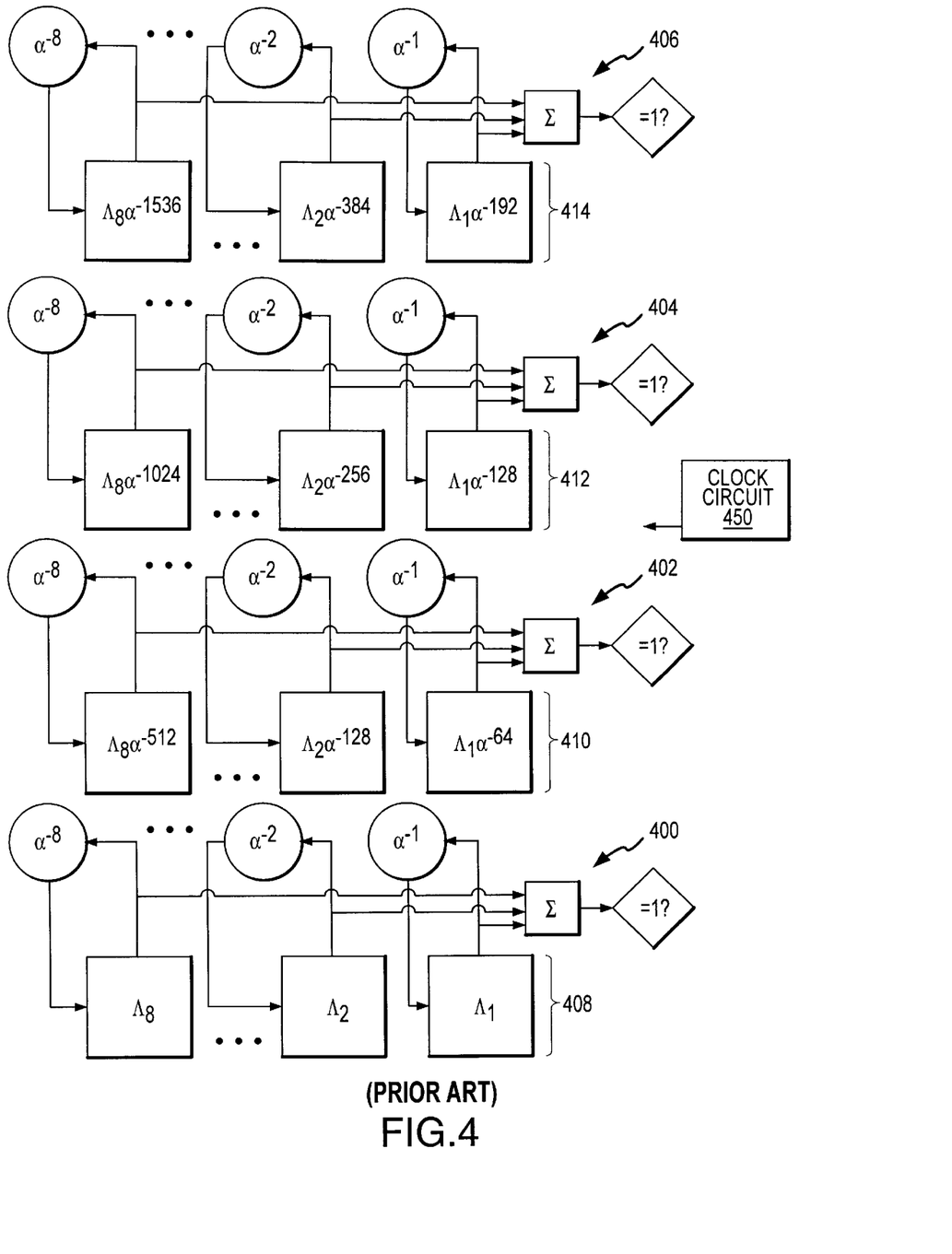
FIG. 4 depicts a block diagram of a parallel Chien Search embodiment.

As shown in FIG. 4, a serial Chien Search can be sped up by replicating the logic of FIG. 3 and allocating portions of the search over multiple modules. For example, FIG. 4 shows a parallel Chien Search (where parallelism P=4) performed by replicated serial modules. Clocking circuitry 450 is coupled to each of registers 408, 410, 412, and 414 to cycle the registers, although the actual clock signal lines have been omitted in FIG. 4 to simplify the drawing. In contrast to the registers 300 of FIG. 3 and the registers 408, the registers 410 are initialized to $\Lambda_1\alpha^{-64}$ through $\Lambda_8\alpha^{-512}$, the registers 412 are initialized to $\Lambda_1\alpha^{-128}$ through $\Lambda_8\alpha^{-1024}$, and the registers 414 are initialized to $\Lambda_1\alpha^{-192}$ through $\Lambda_8\alpha^{-1536}$, as show in FIG. 4. Consequently, over 64 cycles (i.e., cycle 0 through cycle 63), module 400 performs a partial Chien Search on j=0 to 63, module 402 performs a partial Chien Search on j=64 to 127, module 404 performs a Chien Search on j=128 to 191, and module 406 performs a partial Chien Search on j=192 to 254. As such, the parallel Chien Search logic of FIG. 4 requires 64 cycles to exhaustively evaluate the error locator polynomial for all 255 possible roots.

Figure 5:
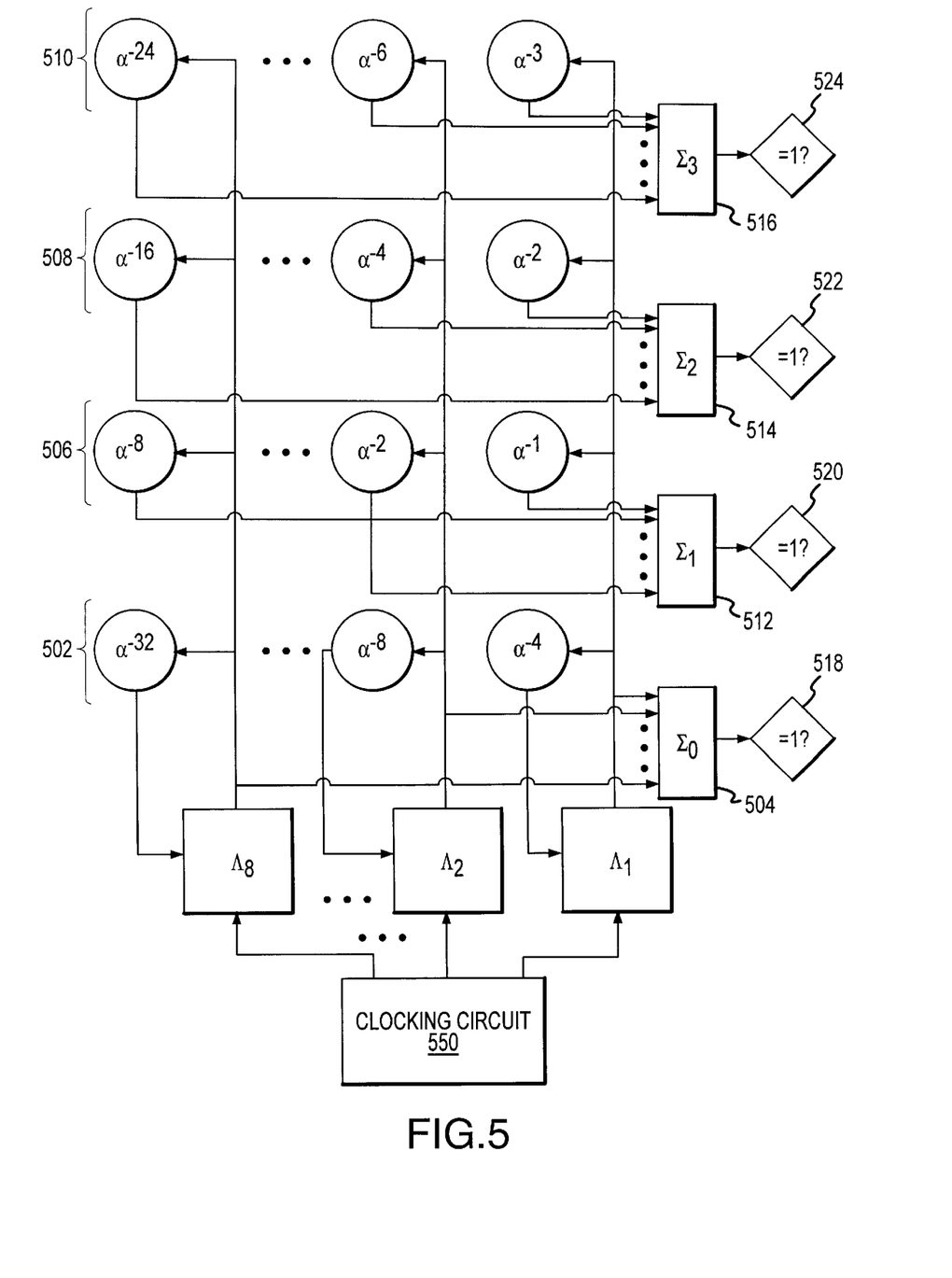
FIG. 5 depicts a storage-efficient parallel Chien Search embodiment in accordance with the present invention.

As shown in FIG. 5, parallel Chien Search logic can be optimized to use fewer logic gates in accordance with the present invention. The replicated registers 410, 412, and 414 of FIG. 4 can be omitted in the logic of FIG. 5, which also implements a parallel Chien Search of parallelism P=4. The registers 500 are loaded with stored values, which are initialized in a manner similar to that of the registers 300 of FIG. 3. Clocking circuitry 550 is coupled to each of the registers 500 to cycle the registers. Furthermore, a base row or rank (rank=0) of fixed finite field multipliers 502 is coupled to the registers 500, and the products of the multiplication operations of multipliers 502 are loaded as stored values into registers 500. The output of each register 500 is input to summer 504 (rank=0). However, additional parallel ranks or non-base rows of fixed finite field multipliers 506, 508, and 510, and summers 512 (rank=1), 514 (rank=2), and 516 (rank=3) are also coupled to the registers 500. In FIG. 5, the multipliers and summers are depicted in indexed rows (i.e., ranks) to more clearly described the logic. The term "rank", however, describes any horizontally corresponding set of multiplier and summer logic, as shown in FIG. 4. Accordingly, a computer system in accordance with the present invention, for example, may include a program executing on the computer where corresponding products of multiplication operations are summed in parallel ranks for evaluation of a root of a polynomial. Furthermore, the products of one "rank" of corresponding multiplication program modules are stored in associated memory locations.

In operation, registers 500 are preferably initialized with the coefficients of the error locator polynomial (e.g., $\Lambda_1$) as shown. The base multiplier rank 502 includes fixed finite field multipliers, each multiplier having a multiplier value equal to $\alpha^{-m \cdot p}$ and being coupled to the output of the m-th register, where m is the register index ranging right to left from one to the number of errors T correctable by the coding and P is the parallelism of the Chien search engine. The parallel multiplier ranks, 506, 508, and 510, however, include fixed field multipliers, each multiplier having a multiplier value equal to $\alpha^{-m \cdot r}$ and being coupled to the output of the m-th register, where m is the registers index ranging right to left from one to the number of errors T correctable by the coding and r is the zero-based rank of the corresponding summer (i.e., each parallel module). For example, in FIG. 5, m ranges from one to eight and r ranges from zero to three. The output of the registers 500 are also coupled to summer 504 and to the fixed finite field multipliers 506, 508, and 510. After each cycle, each register of registers 500 contains the product of the register's previous value times the value of the corresponding fixed finite field multiplier of multipliers 502. The content of each register is also coupled to input to summer 504.

In the same cycle, summer 512 receives the product of each register's value (at the beginning of the cycle) times the value of a corresponding multiplier of multipliers 506, summer 514 receives the product of each register's value times the value of a corresponding multiplier of multipliers 508, and summer 516 receives the product of each register's value times the value of a corresponding multiplier of multipliers 510. The result of summers 504, 512, 514, and 516 are evaluated by comparators 518, 520, 522, and 524, respectively, to determine whether the sum equals one. Consequently, the products of the multiplications having common rank are preferably summed and evaluated together in each cycle. A sum of one indicates that the evaluated element (i.e. the "trial root") is a root of the error locator polynomial.

Each cycle of the Chien Search logic will check P trial roots in parallel. The notation below illustrates examples of elements tested in accordance with the computation cycles and ranks of the Chien Search logic of FIG. 5. In a preferred embodiment, the logic cycles exhaustively tests all possible trial roots.

Cycle 0/Rank 0: $\Lambda_8+\Lambda_7+\Lambda_6+\Lambda_5+\Lambda_4+\Lambda_3+\Lambda_2+\Lambda_1$
(Evaluates $\alpha^{-0}$)
Cycle 0/Rank 1: $\Lambda^8\alpha^{-8}+\Lambda_7\alpha^{-7}+\Lambda_6\alpha^{-6}+\Lambda_5\alpha^{-5}+\Lambda_4\alpha^{-4}+\Lambda_3\alpha^{-3}+\Lambda_2\alpha^{-2}+\Lambda_1\alpha^{-1}$
(Evaluates $\alpha^{-1}$)
Cycle 0/Rank 2: $\Lambda^8\alpha^{16}+\Lambda_7\alpha^{-14}+\Lambda_6\alpha^{-12}+\Lambda_5\alpha^{-10}+\Lambda_4\alpha^{-8}+\Lambda_3\alpha^{-6}+\Lambda_2\alpha^{-4}+\Lambda_1\alpha^{-2}$
(Evaluates $\alpha^{-2}$)
Cycle 0/Rank 3: $\Lambda^8\alpha^{-24}+\Lambda_7\alpha^{-21}+\Lambda_6\alpha^{-18}+\Lambda_5\alpha^{-15}+\Lambda_4\alpha^{-12}+\Lambda_3\alpha^{-9}+\Lambda_2\alpha^{-6}+\Lambda_1\alpha^{-3}$
(Evaluates $\alpha^{-3}$)
Cycle 1/Rank 0: $\Lambda^8\alpha^{-32}+\Lambda_7\alpha^{-28}+\Lambda_6\alpha^{-24}+\Lambda_5\alpha^{-20}+\Lambda_4\alpha^{-16}+\Lambda_3\alpha^{-12}+\Lambda_2\alpha^{-8}+\Lambda_1\alpha^{-4}$
(Evaluates $\alpha^{-4}$)
Cycle 1/Rank 1: $\Lambda_8\alpha^{-40}+\Lambda_7\alpha^{-35}+\Lambda_6\alpha^{-30}+\Lambda_5\alpha^{-25}+\Lambda_4\alpha^{-20}+\Lambda_3\alpha^{-15}+\Lambda_2\alpha^{-10}+\Lambda_1\alpha^{-5}$
(Evaluates $\alpha^{-5}$)
Cycle 1/Rank 2: $\Lambda_8\alpha^{-48}+\Lambda_7\alpha^{-42}+\Lambda_6\alpha^{-36}+\Lambda_5\alpha^{-30}+\Lambda_4\alpha^{-24}+\Lambda_3\alpha^{-18}+\Lambda_2\alpha^{-12}+\Lambda_1\alpha^{-6}$
(Evaluates $\alpha^{-6}$)
Cycle 1/Rank 3: $\Lambda_8\alpha^{-56}+\Lambda_7\alpha^{-49}+\Lambda_6\alpha^{-42}+\Lambda_5\alpha^{-35}+\Lambda_4\alpha^{-28}+\Lambda_3\alpha^{-21}+\Lambda_2\alpha^{-14}+\Lambda_1\alpha^{-7}$
(Evaluates $\alpha^{-7}$)
Cycle 2/Rank 0: $\Lambda_8\alpha^{-64}+\Lambda_7\alpha^{-56}+\Lambda_6\alpha^{-48}+\Lambda_5\alpha^{-40}+\Lambda_4\alpha^{-32}+\Lambda_3\alpha^{-24}+\Lambda_2\alpha^{-16}+\Lambda_1\alpha^{-8}$
(Evaluates $\alpha^{-8}$)
Cycle 2/Rank 1: $\Lambda_8\alpha^{-72}+\Lambda_7\alpha^{-63}+\Lambda_6\alpha^{-54}+\Lambda_5\alpha^{-45}+\Lambda_4\alpha^{-36}+\Lambda_3\alpha^{-27}+\Lambda_2\alpha^{-18}+\Lambda_1\alpha^{-9}$
(Evaluates $\alpha^{-9}$)
Cycle 2/Rank 2: $\Lambda_8\alpha^{-80}+\Lambda_7\alpha^{-70}+\Lambda_6\alpha^{-60}+\Lambda_5\alpha^{-50}+\Lambda_4\alpha^{-40}+\Lambda_3\alpha^{-30}+\Lambda_2\alpha^{-20}+\Lambda_1\alpha^{-10}$
(Evaluates $\alpha^{-10}$)
Cycle 2/Rank 3: $\Lambda_8\alpha^{-88}+\Lambda_7\alpha^{-77}+\Lambda_6\alpha^{-66}+\Lambda_5\alpha^{-55}+\Lambda_4\alpha^{-44}+\Lambda_3\alpha^{-9}\times\Lambda_2\alpha^{-22}+\Lambda_1\alpha^{-11}$
(Evaluates $\alpha^{-11}$)

When the result of a summer in any cycle equals one, the location j of the error is determined by the equation: $j=c*P+r$, where c is the zero-based cycle count, P is the degree of parallelism, and r is the rank of the summer (which is zero-based). As such, the parallel Chien Search logic of FIG. 5 requires 64 cycles to exhaustively evaluate the error locator polynomial for all 255 possible roots, but it requires fewer logic gates than the logic of FIG. 4.

Figure 6:
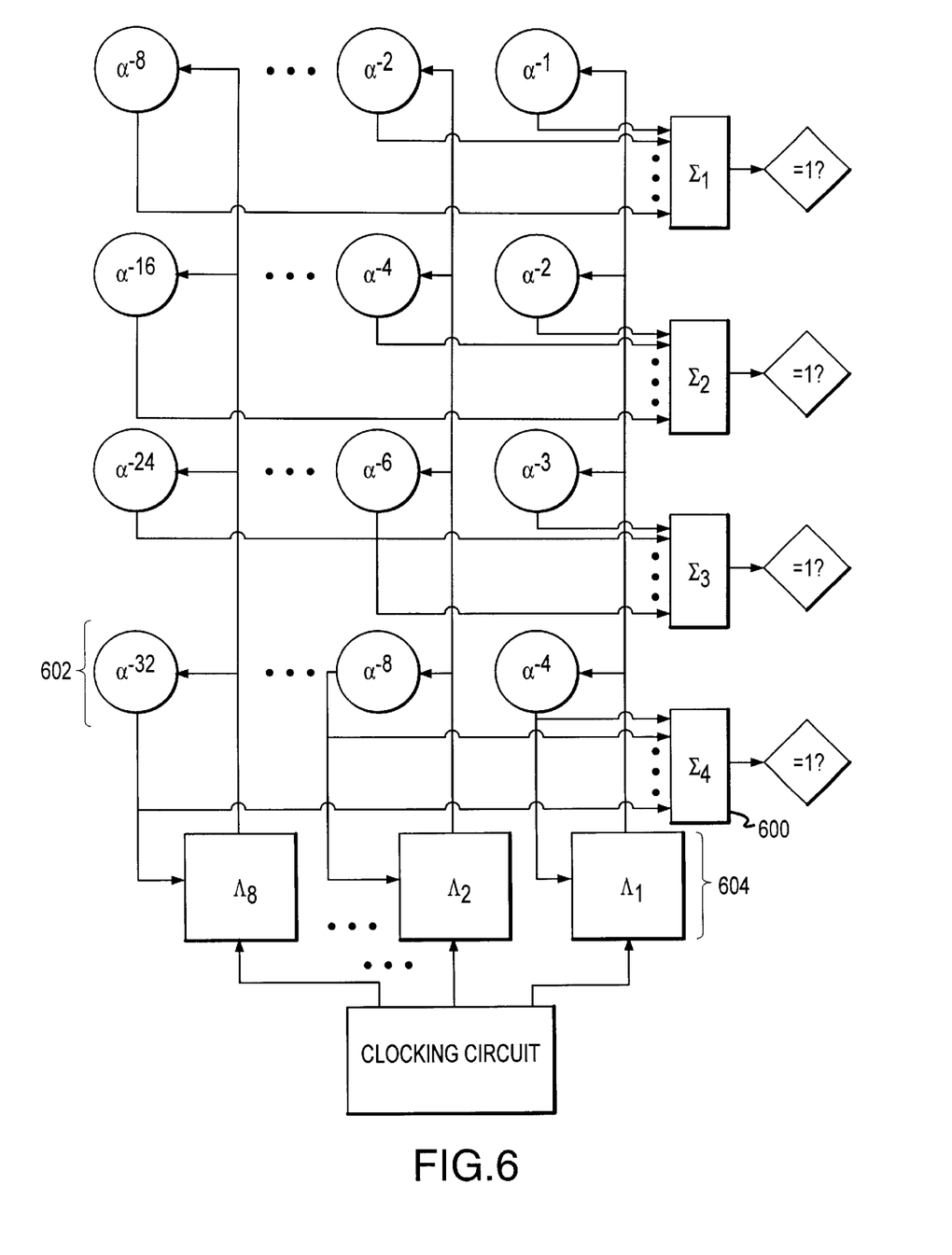
FIG. 6 depicts an alternative storage-efficient parallel Chien Search embodiment in accordance with the present invention.

In an alternate embodiment, as shown in FIG. 6, the inputs to the summer 600 may be coupled to the outputs of multipliers 602, instead of the outputs of registers 604. In this configuration, the possible roots $\alpha^{-1}$, $\alpha^{-2}$, $\alpha^{-3}$, and $\alpha^{-4}$ are evaluated in the first cycle, and $\alpha^{-253}$, $\alpha^{-254}$, $\alpha^{-255}$, and $\alpha^{-256}$. ($\alpha^{-255}$ is equivalent to $\alpha^{-0}$, and $\alpha^{-256}$ is equivalent to $\alpha^{-1}$). In FIG. 6, the ranks are indexed one to P.

While the method disclosed herein has been described and shown with reference to particular steps performed in a particular order, it will be understood that these steps may be combined, sub-divided, or re-ordered to form an equivalent method without departing from the teachings of the present invention. Accordingly, unless specifically indicated herein, the order and grouping of the steps is not a limitation of the present invention.

Moreover, while there have been described herein the principles of the present invention in conjunction with specific system and method implementations, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. For example, it should be understood that a system in accordance with the present invention may be implemented in discrete components or multiple integrated components or may be integrated into a single integrated chip, with or without other functionality on the chip. Moreover, the system and method disclosed may be implemented in hardware or software in accordance with the present invention.

Although claims have been formulated in this application to particular combinations of features, it should be understood that the scope of the disclosure herein also includes any novel feature or any novel combination of features disclosed either explicitly or implicitly for any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived thereof.

What is claimed is:

1. A parallel search system for determining roots of a polynomial, each root being one of a set of elements of a Galois Field, comprising:

N data storage units, each containing a stored value; and a plurality of ranks, each rank having N parallel multipliers and a summer connected to the N parallel multipliers, each multiplier containing a stored multiplier value, each multiplier in each rank corresponding to one multiplier in each other rank to form N groups of corresponding multipliers, each group of corresponding multipliers connected to a different one of the N data storage units which corresponds to the connected group of corresponding multipliers, each of the corresponding multipliers in each group receiving the stored value contained in the data storage unit corresponding to the group, each multiplier producing a product of the multiplier value contained therein and the stored value received from the corresponding data storage unit, each summer receiving the products from the N parallel multipliers to which it is connected and producing a sum of the received products, the sum indicating whether one of the roots of the polynomial has been determined.

2. A parallel search system as defined in claim 1, wherein the plurality of ranks includes a base rank and the polynomial includes coefficients, further comprising:

a clocking circuit capable of defining a first cycle and a second cycle, each of the stored values being equal to a corresponding coefficient of the polynomial in the first cycle, and each of the stored values being equal to a corresponding product produced by the parallel multipliers of the base rank in the second cycle.

3. A parallel search system as defined in claim 1, wherein an initial multiplier value of the parallel multipliers of each rank equals an element of the Galois Field, and each other multiplier value of the parallel multipliers of the rank equals the initial multiplier value raised to an integer power.

4. A parallel search system as defined in claim 1, wherein each of the parallel multipliers includes a fixed finite field multiplier.

5. A parallel search system as defined in claim 1 wherein:

the plurality of ranks includes a base rank and at least one non-base rank; and the products produced by the parallel multipliers of the base rank replace the stored values in the data storage units.

6. A parallel search system as defined in claim 1 wherein:

if the sum produced by the summer in one of the ranks indicates that one of the roots of the polynomial has been determined, then the multiplier value of the first parallel multiplier in the rank is the root.

7. A parallel search system as defined in claim 1 wherein:

each rank includes a comparator connected to the summer for receiving the sum produced by the summer and determining whether the sum is zero; and a determination that the sum produced by the summer in one of the ranks is zero by the comparator in the rank indicates that one of the roots of the polynomial has been determined.

8. A parallel search system as defined in claim 1 wherein:

each rank includes a comparator connected to the summer for receiving the sum produced by the summer and determining whether the sum is nonzero; and a determination that the sum produced by the summer in one of the ranks is nonzero by the comparator in the rank indicates that one of the roots of the polynomial has been determined.

9. A parallel search system for determining a root of an error locator polynomial having degree T where T is a positive integer, the error locator polynomial being capable of locating T errors, the root being one of a set of elements of a Galois Field, the parallel search system comprising:

T data storage units for recording T stored values;

P summers; and a P rows×T columns array of multipliers for producing a corresponding P rows×T columns array of product values, the P rows including a base row, each row of the array of multipliers corresponding to one of the rows of the array of product values and being connected to a corresponding one of the summers, each column of the array of multipliers being coupled to a corresponding one of the data storage units, each multiplier of the base row of the array of multipliers being coupled to a corresponding one of the data storage units, each column of the array of multipliers receiving the stored value from the corresponding data storage unit to which the column is coupled, each row of the array of multipliers supplying the corresponding row of the array of product values to the corresponding summer to which the row is connected, each multiplier of the base row of the array of multipliers supplying the corresponding product value to the corresponding data storage unit to which the multiplier is connected;

and wherein each summer sums the corresponding row of the array of product values and each sum indicates whether a root of the error locator polynomial has been determined.

10. A parallel search system as defined in claim 9 wherein the error locator polynomial includes coefficients and each of the stored values is initialized to one of the coefficients of the error locator polynomial.

11. A parallel search system as defined in claim 9 wherein each multiplier of the array of multipliers includes a fixed finite field multiplier.

12. A parallel search system as defined in claim 9 wherein each multiplier of the array of multipliers includes a multiplier value equaling $\alpha^{-m \cdot r}$, where $\alpha^{-m \cdot r}$ is one of the elements of the Galois Field, m is an integer between one and T inclusive, and r is an integer between one and P inclusive.

13. A parallel search system as defined in claim 9 wherein the P rows include at least one non-base row, each multiplier of the base row of the array of multipliers includes a base multiplier value equaling $\alpha^{-m \cdot P}$ and each multiplier of the non-base row of the array of multipliers includes a non-base multiplier value equaling $\alpha^{-m \cdot P}$, where $\alpha^{-m \cdot r}$ and $\alpha^{-m \cdot r}$ are elements of the Galois Field, m is an integer between one and T inclusive, and r is an integer between one and P−1 inclusive.

14. A parallel search system as defined in claim 9 further comprising:

clocking logic causing a previous cycle and a next cycle; and wherein each of the stored values in the next cycle includes a corresponding one of the product values of the base row of the array of multipliers, as produced in the previous cycle.

15. A parallel search system as defined in claim 9 further comprising:
P comparators coupled to a corresponding one of the summers, each comparator being configured for evaluating whether the sum from the corresponding summer indicates whether the root of the error locator polynomial has been determined.

16. A method for determining locations of one or more errors in a codeword, wherein the error locations are identified by powers of roots of an error-locator polynomial, the roots of the error-locator polynomial are determined by multiplier values arranged in a plurality of rows and columns, the multiplier values are elements of a Galois Field, each multiplier value is multiplied with one of a plurality of coefficient values, the coefficient values are arranged in one row in which each coefficient value corresponds to one column of the multiplier values, the method comprising the steps of:
for each row of multiplier values, producing products of the multiplier values and the corresponding coefficient values in the one row of coefficient values;
for each row of multiplier values, adding the products into a sum;
for each sum, determining whether the sum indicates that one of the roots of the error-locator polynomial has been determined; and
for each determined root, identifying the error location in the codeword by the power of the determined root.

17. A method as defined in claim 16, wherein each row of the multiplier values is identified by a zero-based rank, comprising the further steps of:
cycling through the producing, adding, determining and identifying steps for a number of computation cycles required to determine the roots of the entire error-locator polynomial, the number of computation cycles being identified by a zero-based cycle count; and
for each determined root, calculating the error location by adding the rank of the row of multiplier values from which the root was determined to a product of a total number of the rows of the multiplier values and the cycle count at the computation cycle in which the root was determined.

18. A method as defined in claim 16, wherein the plurality of rows includes a base row and a non-base row, and each row of multiplier values includes a first multiplier value of the row, comprising the further steps of:
setting the first multiplier value of the base row of multiplier values to $\alpha^{-P}$, where $\alpha^{-P}$ equals a first element of the Galois Field and P equals a total number of the rows; and
setting the first multiplier value of the non-base row of multiplier values to $\alpha^{-r}$, where $\alpha^{-r}$ equals a second element of the Galois Field and r is an integer between one and P−1 inclusive.

19. A method as defined in claim 16, wherein the rows include a base row, the multiplier values are contained in a plurality of multipliers arranged in the plurality of rows and columns, the coefficient values are contained in a plurality of data storage units arranged in the one row, each data storage unit is connected to the multipliers in a corresponding column of the multipliers, a column of summers corresponds to each column of the multipliers, each summer is connected to the multipliers in a corresponding row of the multipliers, comprising the further steps of:

supplying the coefficient value from each data storage unit to the multipliers in the corresponding column of multipliers;
supplying the product from each multiplier to the summer connected thereto for adding with the other products from the other multipliers connected to the same summer;
supplying the product from each multiplier in the base row of the multipliers to the corresponding data storage unit in the one row of data storage units; and
storing the products from the base row of the multipliers in the one row of data storage units.

20. A method as defined in claim 19, wherein the error-locator polynomial includes the coefficient values, comprising the further step of:
initializing the data storage units to store the coefficient values of the error-locator polynomial.

21. A method as defined in claim 19, wherein a column of comparators corresponds to the column of summers, each comparator is connected to and receives the sum from the corresponding summer, comprising the further steps of:
for each comparator, comparing the received sum with a known value; and
for each comparator, when the received sum equals the known value, determining that the sum indicates that the one of the roots of the error-locator polynomial has been determined.

22. A method as defined in claim 19, wherein a column of comparators corresponds to the column of summers, each comparator is connected to and receives the sum from the corresponding summer, comprising the further step of:
for each comparator, when the received sum equals zero, determining that the sum indicates that the one of the roots of the error-locator polynomial has been determined.

23. A method as defined in claim 19, wherein a column of comparators corresponds to the column of summers, each comparator is connected to and receives the sum from the corresponding summer, comprising the further step of:
for each comparator, when the received sum is nonzero, determining that the sum indicates that the one of the roots of the error-locator polynomial has been determined.

24. A program storage medium, readable by a computer, tangibly embodying a program of instructions executable by the computer for determining locations of one or more errors in a codeword, wherein the error locations are identified by powers of roots of an error-locator polynomial, the roots of the error-locator polynomial are determined by multiplier values arranged in a plurality of rows and columns, the multiplier values are elements of a Galois Field, each multiplier value is multiplied with one of a plurality of coefficient values, the coefficient values are arranged in one row in which each coefficient value corresponds to one column of the multiplier values, the program comprising instructions for:
for each row of multiplier values, producing products of the multiplier values and the corresponding coefficient values in the one row of coefficient values;
for each row of multiplier values, adding the products into a sum;
for each sum, determining whether the sum indicates that one of the roots of the error-locator polynomial has been determined; and
for each determined root, identifying the error location in the codeword by the power of the determined root.

25. A program storage medium as defined in claim 24, wherein the plurality of rows includes a base row and a non-base row, and each row of multiplier values includes a first multiplier value of the row, the program comprising further instructions for:

setting the first multiplier value of the base row of multiplier values to $\alpha^{-P}$, where $\alpha^{-P}$ equals a first element of the Galois Field and P equals a total number of the rows; and setting the first multiplier value of the non-base row of multiplier values to $\alpha^{-r}$, where $\alpha^{-r}$ equals a second element of the Galois Field and r is an integer between one and P–1 inclusive.

26. A program storage medium as defined in claim 24, wherein the error-locator polynomial includes the coefficient values, the program comprising further instructions for:

initializing the data storage units to store the coefficient values of the error-locator polynomial.

27. A program storage medium as defined in claim 24, wherein the rows include a base row, and the program comprises further instructions for:

replacing the coefficient values in the one row of coefficient values with the products from the base row of the multipliers.

28. A program storage medium as defined in claim 24, wherein the program comprises further instructions for:

for each sum, comparing the sum with a known value; and for each sum, when the sum equals the known value, determining that the sum indicates that the one of the roots of the error-locator polynomial has been determined.

29. A program storage medium as defined in claim 24, wherein the program comprises further instructions for:

for each sum, when the sum equals zero, determining that the one of the roots of the error-locator polynomial has been determined.

30. A program storage medium as defined in claim 24, wherein the program comprises further instructions for:

for each sum, when the sum is nonzero, determining that the one of the roots of the error-locator polynomial has been determined.

\* \* \* \* \*